United States Patent
Coteus et al.

(10) Patent No.: US 9,912,324 B2
(45) Date of Patent: Mar. 6, 2018

(54) OPEN-LOOP QUADRATURE CLOCK CORRECTOR AND GENERATOR

(71) Applicant: International Business Machines Corporation, Armonk, NY (US)

(72) Inventors: Paul W. Coteus, Yorktown, NY (US); Daniel M. Dreps, Georgetown, TX (US); Kyu-hyoun Kim, Chappaqua, NY (US); Glen A. Wiedemeier, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/841,874

(22) Filed: Sep. 1, 2015

(65) Prior Publication Data

US 2017/0063353 A1   Mar. 2, 2017

(51) Int. Cl.
| | |
|---|---|
| *H03H 11/16* | (2006.01) |
| *H03K 5/01* | (2006.01) |
| *H04L 27/12* | (2006.01) |
| *G06F 1/12* | (2006.01) |
| *H03K 5/26* | (2006.01) |
| *H03K 5/00* | (2006.01) |

(52) U.S. Cl.
CPC ............ *H03K 5/01* (2013.01); *G06F 1/12* (2013.01); *H03K 5/26* (2013.01); *H04L 27/127* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 7,298,222 B2 | 11/2007 | Rosik et al. | |
| 7,321,640 B2 | 1/2008 | Milne et al. | |
| 7,474,715 B1 | 1/2009 | Ni et al. | |
| 7,612,621 B2 | 11/2009 | Kim et al. | |
| 7,683,725 B2 | 3/2010 | Kim et al. | |
| 7,791,391 B2 | 9/2010 | Yoon et al. | |
| 8,004,335 B2 | 8/2011 | Kim et al. | |
| 8,139,700 B2 | 3/2012 | Beukema et al. | |

(Continued)

OTHER PUBLICATIONS

Zaki, Tarek et al, Design of a Quadrature Clock Conditioning Circuit in 90-nm CMOS Technology, International Conference on Microelectronics, Dec. 2008, pp. 425-428, IEEE, Piscataway, United States.

(Continued)

*Primary Examiner* — Cassandra Cox
(74) *Attorney, Agent, or Firm* — Patterson + Sheridan, LLP (57) ABSTRACT

Embodiments described herein include a quadrature phase corrector (QPC) which includes multiple differential amplifies for correcting the phase of one or more clock signals. In one embodiment, the differential amplifiers are arranged in an input stage, cross-coupled stage, and ring stage. The input stage receives and buffers the input clock signal (or signals). The cross-coupled stage includes one or more latches that force one clock signal high and another low which causes the QPC to oscillate. The ring stage outputs four clock signals with adjusted phases relative to the input clock signals. In one example, the ring stage outputs a quadrature clock signal that includes four clock signals phase shifted by 90 degrees.

19 Claims, 6 Drawing Sheets

(56) References Cited

U.S. PATENT DOCUMENTS

| | | |
|---|---|---|
| 8,253,466 B2 | 8/2012 | Jeffries et al. |
| 8,552,781 B2 | 10/2013 | Mosalikanti et al. |
| 2007/0002993 A1 | 1/2007 | Wang et al. |
| 2008/0036509 A1* | 2/2008 | Jang ............... H03K 5/135 327/141 |
| 2008/0265959 A1* | 10/2008 | Kimura ............ H03L 7/0805 327/156 |
| 2014/0086364 A1 | 3/2014 | Schell et al. |
| 2014/0253195 A1 | 9/2014 | Chandrasekaran et al. |
| 2014/0320202 A1 | 10/2014 | Iyer et al. |
| 2014/0340120 A1 | 11/2014 | Leibowitz et al. |

OTHER PUBLICATIONS

Anonymous, Quadrature-Based Clock-Doubling Circuit: An IP.com Prior Art Database Technical Disclousre,, 4 pages, Feb. 25, 2005, ip.com, Fairport, United States.

Chen, Shuai et al., An 8Gb/s 0.75mW/Gb/s Injection-Locked Receiver with Constant Jitter Tracking Bandwidth and Accurate Quadrature Clock Generation in 40 nm CMOS, 21st IEEE International Conference on Electronics, Circuits and Systems, Dec. 2014, pp. 9-12, IEEE, Piscataway, United States.

Kim, Kyu-hyoun et al., A 2.6mW 370MHz-to-2.5GHz Open-Loop Quadrature Clock Generator, International Solid-State Circuits Conference, 2008, 3 pages, IEEE, Piscataway, United States.

\* cited by examiner

OPEN-LOOP QUADRATURE CLOCK CORRECTOR AND GENERATOR

BACKGROUND

The present invention relates to correcting clock phases, and more specifically, to using a quadrature phase corrector that includes differential amplifiers for adjusting phase shifts between clock signals.

In source-synchronous communication systems, a transmitter sends a clock signal along with data signals. A receiver uses the received clock signal to detect (or read) the data in the data signals signal. In non-source-synchronous communication systems, the transmitter sends only the data signals to the receiver. Using clock data recovery, the receiver generates a clock that is then used to detect the data in the received data signals.

Regardless whether the communication system is source-synchronous or non-source-synchronous, the receiver may need to adjust the phase of the clock before reading the data. For example, skew or noise may cause the clock signal and the data signals to be misaligned. To detect the data, the receiver phase shifts the clock signal so that the rising edge of the clock signal is in the middle of the data signal eye (or unit interval). To do so, the receiver typically includes a phase locked loop (PLL) for phase shifting the clock signal; however, the PLL introduces a long delay and can lead to unstable results.

SUMMARY

One embodiment of the present invention is a quadrature phase corrector that includes at least one input interface configured to receive an input clock signal, first, second, third, and fourth output interfaces configured to output respective clock signals of a quadrature clock signal, and a first input stage coupled to the input port. The quadrature phase corrector also includes a first differential amplifier where two inputs of the first differential amplifier are coupled to two outputs of the first input stage and two outputs of the first differential amplifier are coupled to the first and second output interfaces and a second differential amplifier where two inputs of the second differential amplifier are coupled to the third and fourth output interfaces and two outputs of the differential amplifier are coupled to the first and second output interfaces.

Another embodiment of the present invention is quadrature phase corrector that includes first, second, third, and fourth output interfaces configured to output respective clock signals of a quadrature clock signal and first and second input stages configured to receive input clock signals where two outputs of the first input stage are coupled to the first and second output interfaces and two outputs of the second input stage are coupled to the third and fourth output interfaces. The quadrature phase corrector also includes first and second cross-coupled stages where inputs and outputs of the first cross-coupled stage are coupled to the first and second output interfaces and inputs and outputs of the second cross-coupled stage are coupled to the third and fourth output interfaces, and first and second ring stages where two inputs of the first ring stage are coupled to the third and fourth output interfaces and two outputs of the first ring stage are coupled to the first and second output interfaces, and where two inputs of the second ring stage are coupled to the first and second output interfaces and two outputs of the second ring stage are coupled to third and fourth output interfaces.

Another embodiment of the present invention is a quadrature phase generator that includes a first quadrature phase corrector configured to receive input clock signals and a second quadrature phase corrector configured to receive a first quadrature clock signal from the first quadrature phase corrector and output a second quadrature clock signal. Moreover, the first and second quadrature phase correctors each comprises a plurality of differential amplifiers, and wherein the first quadrature phase corrector is configured to correct a phase shift between respective clock signals in the first quadrature clock signal relative to a phase shift between the input clock signals, and the second quadrature phase corrector is configured to correct a phase shift between respective clock signals in the second quadrature clock signal relative to the phase shift between the respective clock signals in the first quadrature clock signal.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein include a quadrature phase corrector (QPC) which includes multiple differential amplifies for correcting the phase of one or more clock signals. In one embodiment, the differential amplifiers are arranged in an input stage, a cross-coupled stage, and a ring stage. The input stage receives and buffers the input clock signal (or signals). The cross-coupled stage includes one or more latches that force one clock signal high and another low which causes the QPC to oscillate. The ring stage corrects the phase of a quadrature clock signal relative to the phase difference of clock signals inputted into the QPC. In one example, the QPC outputs a quadrature clock signal that includes four clock signals phase shifted by 90 degrees to form a first (reference) clock signal, a second clock signal phase shifted 90 degrees from the first clock signal, a third clock signal phase shifted 180 degrees from the first clock signal and a fourth clock signal phase shifted 270 degrees from the first clock signal.

In one embodiment, a communication system includes a quadrature phase generator comprising a chain of QPCs. The first QPC in the chain may use a differential clock signal as an input. The differential clock signal may include a first clock signal with a 0 degree phase shift and second clock signal with a 180 degree phase shift (i.e., an inverted clock signal). The output of the first QPC is ideally a quadrature clock signal with a first (reference) signal with a 0 degree phase shift, a second signal with a 90 degree phase shift relative to the first signal, a third signal with a 180 degree phase shift relative to the first signal, and a fourth signal with a 270 degree phase shift relative to the first signal. However, because of the phase error resulting from converting a differential clock signal into a quadrature clock signal, the quadrature clock signal outputted by the QPC may be off from the ideal or desired phase relationship. For example, the four individual clock signals in the quadrature clock signal may have phase shifts of 0 degrees, 70 degrees, 200 degrees, and 260 degrees relative to a reference clock signal. As such, the output clock signals of the first QPC are used as inputs to a second QPC in the daisy chain whose outputs may be used as inputs to a third QPC, and so forth. As the quadrature clock signal continues through the daisy chain of QPCs, the phase shifts of the four clock signals approach the ideal phase shifts. In one embodiment, the quadrature clock signal outputted from the last QPC in the quadrature phase generator is used to recover data received from a transmitter. For example, one of the clock signals in the quadrature clock signal has a phase shift that aligns its rising edge with the middle of the data signal eye (or unit interval). Using this clock signal, the receiver can latch or detect the received data signals in the middle of the signal eye thereby mitigating the chance that noise or jitter will cause the receiver to misread the data.

Figure 1A:
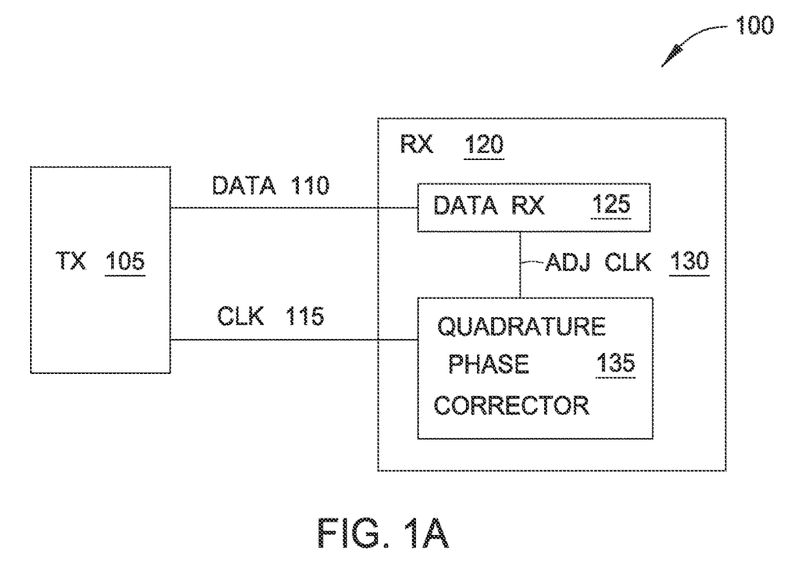
FIGS. 1A and 1B illustrate communication systems with quadrature phase correctors, according to one embodiment described herein.
Figure 1B:
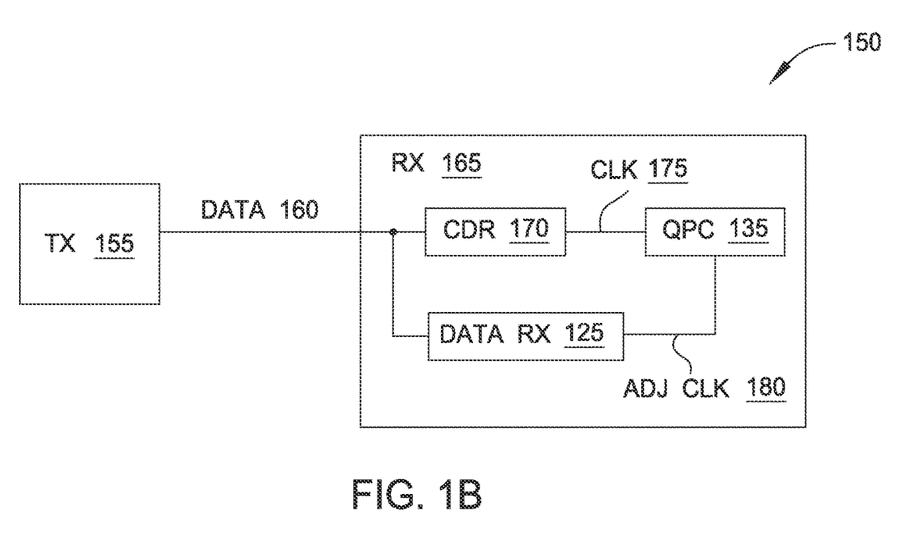

FIGS. 1A and 1B illustrate communication systems 100, 150 with QPCs 135, according to one embodiment described herein. The communication system 100 in FIG. 1A includes a transmitter 105 and receiver 120. Because the transmitter 105 transmits a clock signal 115 along with data signals 110 to the receiver 120, the communication system 100 is a source-synchronous communication system. Example systems that may use source synchronous systems include DDR SDRAM, buses in processor chips, some versions of system packet interface (SPI) and many others.

To accurately read or detect the data, the receiver includes a data receiver 125 and a QPC 135. In one embodiment, the clock signal 115 may be misaligned with the data 110. For example, the transmitter 105 may align the data signals 110 and clock signal 115 such that a rising edge of the clock signal 115 corresponds to a rising edge of the data signal 110. However, to read the data, the receiver 120 adjusts the clock using the QPC 135 so that the clock signal is in the middle of the eye of the data signal. For example, if the data rate and clock rate are the same, then the clock signal is shifted by 180 degrees—e.g., half a unit interval. However, to save power, many communication systems transmit a clock signal 115 that is half as fast as the data rate. Put differently, a signal clock cycle is two unit intervals. In this case, phase shifting the clock by 90 degree results in a clock signal that aligns with the middle of the data signal eye— e.g., half a unit interval.

The QPC 135 can take a single clock signal, a differential clock signal, or a quadrature clock signal as an input and generate a corrected quadrature clock signal that includes four clock signals that ideally have a 0, 90, 180, and 270 degrees phase shift spacing. That is, the quadrature clock signal includes a first clock signal at 0 degrees, a second clock signal at 90 degrees, a third clock signal at 180 degrees, and a fourth clock signal at 270 degrees. Although FIG. 1B only illustrates one QPC 135, as discussed below, the receiver 120 may include multiple daisy-chained QPCs in order to generate the ideal quadrature clock signal.

Assuming the clock signal with the 90 degree phase shift falls within the middle of the data signal eye, the receiver uses this clock signal as the adjusted clock signal 130 which is transmitted to the data receiver 125. The data receiver 125 then uses the adjusted clock signal 130 to latch or detect the data signals 110. In this manner, the receiver 120 includes one or more QPCs 135 which generate a quadrature clock signal which has individual clock signals that are shifted by approximately 90 degrees relative to each other.

FIG. 1B illustrates a non-source-synchronous communication system 150 where the transmitter 155 transmits only data signals 160 to the receiver 165—i.e., the transmitter 155 does not transmit a clock signal to the receivers 165. Instead, the receiver 165 uses a clock data recovery (CDR) module 170 to generate a clock 175 from the received data signals 160. The embodiments herein are not dependent on any particular technique or circuit for implementing the CDR module 170, and thus, the details of the module 170 are not provided herein. As discussed above, the receiver 165 may phase shift the clock 175 so that the rising edge of the clock aligns with the middle of the data signal eye in order to detect the data in the presence of noise or jitter.

As shown, the QPC 135 uses the clock 175 as an input to generate an adjusted clock 180. As above, the QPC 135 uses the clock 175 (which can be a single clock signal, a differential clock signal, a quadrature clock signal, etc.) to generate a corrected quadrature clock signal with a first clock signal at 0 degrees, a second clock signal at 90 degrees, a third clock signal at 180 degrees, and a fourth clock signal at 270 degrees. Receiver 165 uses the clock signal that has the desired phase shift as the adjusted clock signal 180 which is transmitted to the data receiver 125. For example, if the clock signal 175 is the same frequency as the data rate (and its rising edge is aligned with the rising edge of the data signal), then the clock signal outputted by the QPC 135 with a phase shift of 180 degrees is used as the adjusted clock signal 180. However, if the clock signal 175 is half the frequency of the data rate, then the clock signal with a phase shift of 90 degrees is used as the adjusted clock signal 180. As shown in FIGS. 1A and 1B, the QPC 135 can be used in either a source-synchronous or a non-source-synchronous communication system to generate a quadrature clock signal with 90 degree phase shifts between the individual clock signals. A receiver can use one or more of the individual clock signals to detect or read the data signals received from a transmitter.

Figure 2:
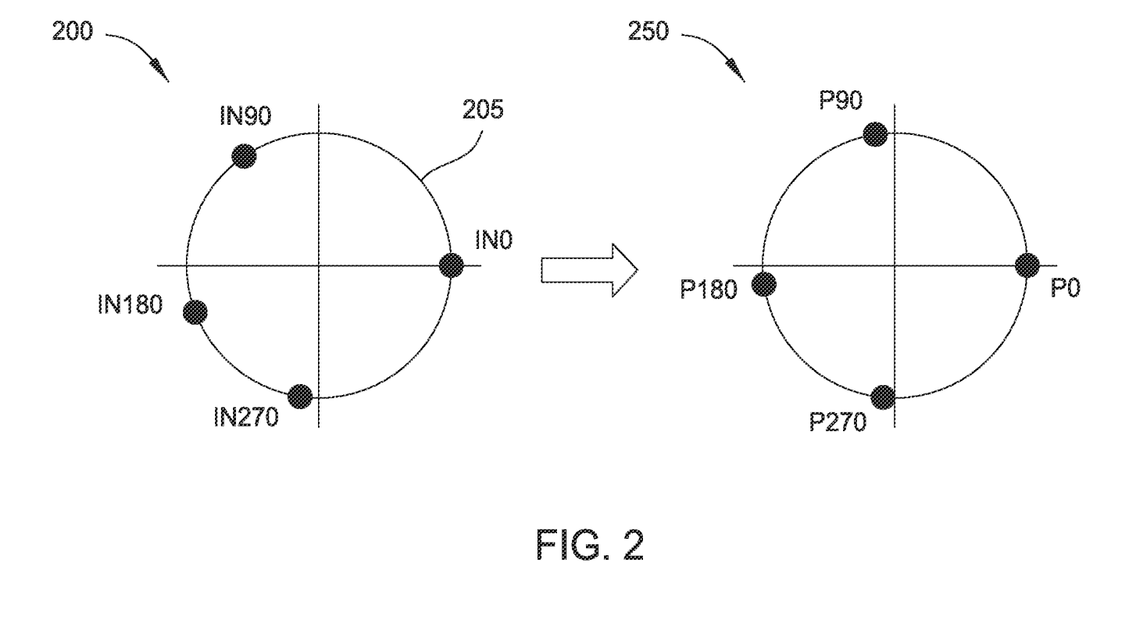
FIG. 2 illustrates adjusting clock signal phases using a quadrature phase corrector, according to one embodiment described herein.

FIG. 2 illustrates adjusting clock signal phases using a QPC, according to one embodiment described herein. Coordinate system 200 illustrates the phases corresponding to an input quadrature clock signal. As shown, the individual clock signals in the input quadrature clock signal are off from the ideal values. For example, clock signal IN90 (which should have a 90 degree phase shift relative clock signal IN0) has an actual phase shift of approximately 120 degrees. Clock signal IN180 has an actual phase shift of approximately 190 relative to clock signal IN0, but should have a phase shift of 180 degrees. Clock signal IN270 has an actual phase shift of approximately 265 degrees relative to clock signal IN0 but should have a phase shift of 270 degrees.

Coordinate chart 250 illustrates the result of inputting the quadrature clock signal shown in coordinate chart 200 through the QPC. The QPC corrects the individual clock signals to bring their phase shifts relative to the reference clock signal P0 closer to the ideal phase shift values—i.e., 90, 180, and 270 degrees. As used herein, "correcting" the phase shifts of the input clock signals does not necessarily mean the resulting individual signals of the quadrature clock signal have the ideal phase shift values. Instead, the QPC improves these phase shift values to bring the output P0, P90, P180, and P270 closer to the ideal phase shift values. As mentioned above, multiple QPCs can be daisy chained to continue to improve the phase shift values until these values are sufficiently close to the ideal values—e.g., within 1-5% of the ideal values.

Although FIG. 2 illustrates using a quadrature clock signal as an input to the QPC, this is a not a requirement. Indeed, the QPC can output a quadrature clock signal even if a single clock signal or a differential clock signal is used. For example, if a single clock signal is provided, the clock signal may be fed into one of the four inputs of the QPC while the other three inputs may be provided by feedback loops with the output of the QPC. Although the input signals may have phase shifts different than the ideal phase shift values, as this quadrature signal propagates through a chain of QPCs, the four clock signals approach the ideal phase shift values for the quadrature clock signal. Thus, the QPC (or a chain of QPCs) can generate a quadrature clock signal even if the received clock has less than four individual clock signals.

Figure 3:
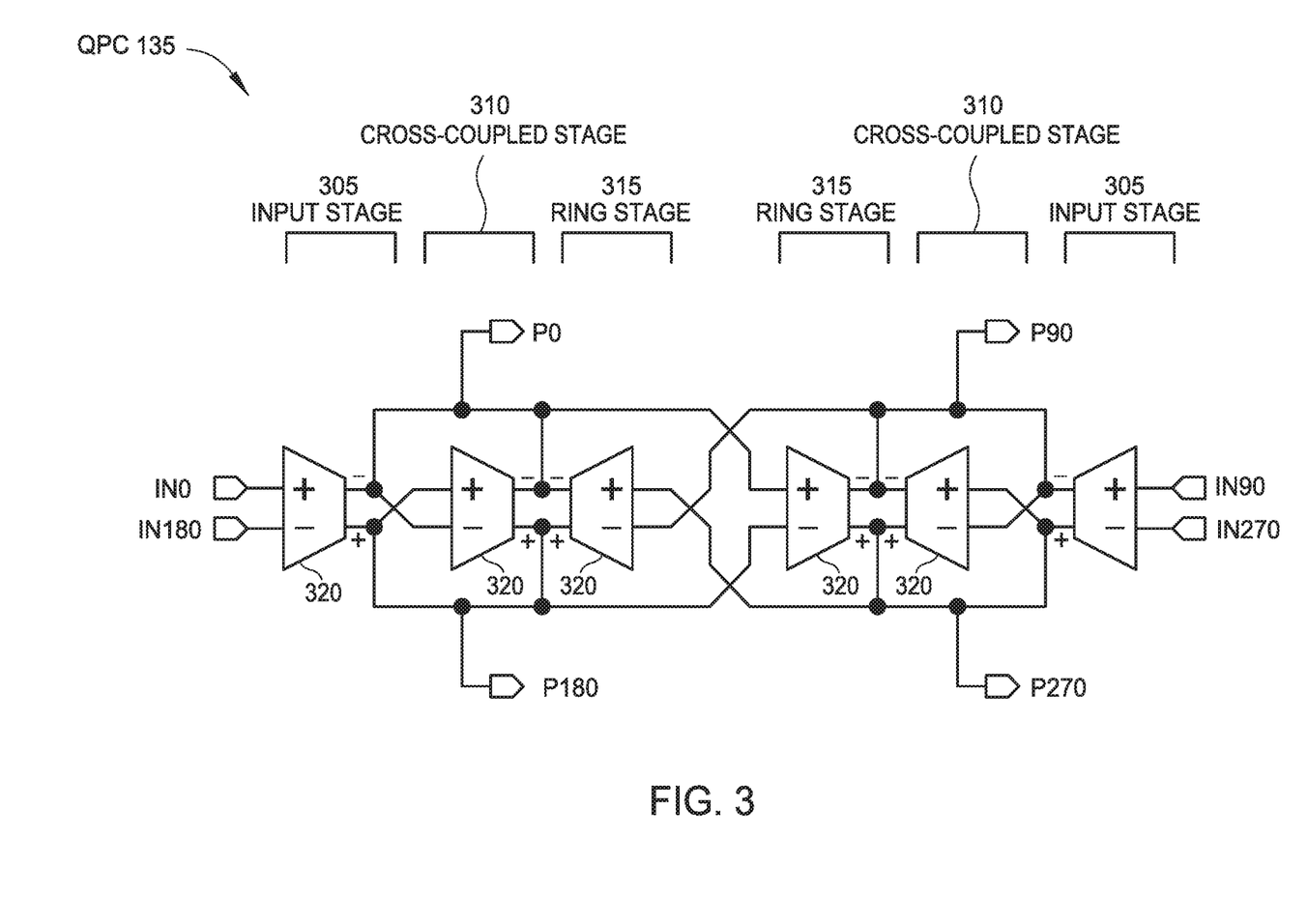
FIG. 3 illustrates a block diagram of a quadrature phase corrector, according to one embodiment described herein.

FIG. 3 illustrates a block diagram of the QPC 135, according to one embodiment described herein. The QPC 135 includes four inputs IN0, IN90, IN180, and IN270 used to generate four outputs P0, P90, P180, and P270 at output interfaces which form the corrected quadrature clock signal. That is, clock signal P0 is the reference clock signal, clock signal P90 has a 90 degree phase shift from P0, clock signal P180 has a 180 degree phase shift from P0, and clock signal has a 270 degree phase shift from P0. However, as shown in FIG. 2, the actual phase shifts of the clock signals P90, P180, and P270 may not match the ideal phase values. Rather, the QPC 135 improves the phase shift spacing of signals P0, P90, P180, and P270 relative to the phase shift spacing of signals IN0, IN90, IN180, and IN270 provided at four input interfaces or ports of the QPC 135.

The input clock signals IN0, IN90, IN180, and IN270 are inputted into differential amplifiers 320 which compare the inputs to amplify the difference between the input voltages. The differential amplifiers 320 are arranged to form an input stage 305, a cross-coupled stage 310, and a ring stage 315. The outputs of the input stages 305 generate differential signals that are coupled to the outputs P0, P90, P180, and P270 of the quadrature clock signal as well as the inputs to the cross-coupled stages 310. The outputs of the differential amplifiers 320 in the cross-coupled stages 310 and the ring stages 315 are also coupled to the outputs P0, P90, P180, and P270 of the quadrature clock signal. The inputs of the ring stage 315 are the output clock signals P0, P90, P180, and P270. The functionality of input stage 305, cross-coupled stage 310, and ring stage 315 is discussed is greater detail below.

Figure 4:
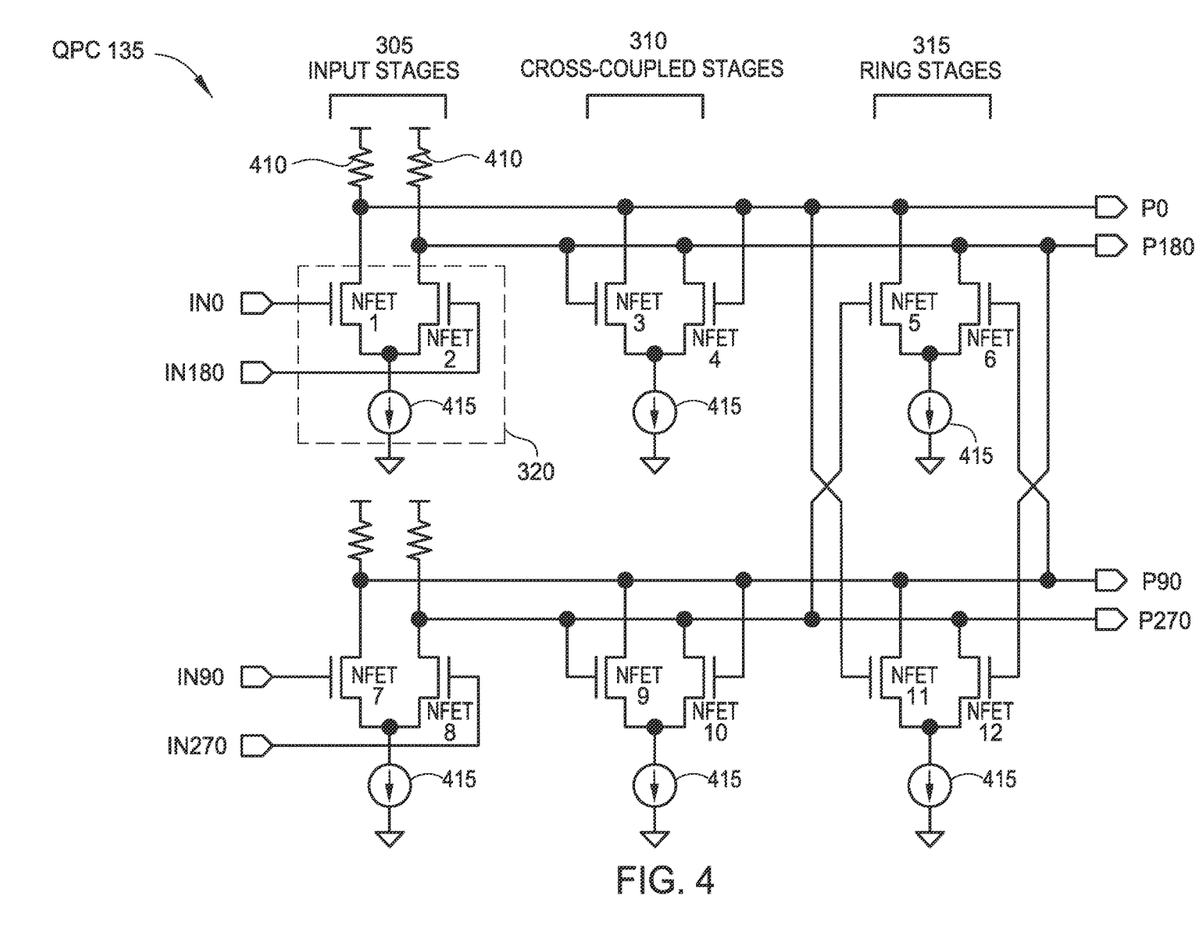
FIG. 4 illustrates a circuit diagram of a quadrature phase corrector, according to one embodiment described herein.

FIG. 4 illustrates a circuit diagram of the QPC 135, according to one embodiment described herein. As shown, FIG. 4 illustrates one example of circuitry and wiring that may be used to form the arrangement of differential amplifiers 320 shown in FIG. 3. In this embodiment, each differential amplifier 320 includes a pair of NFETs (e.g., NFET1 and NFET2) whose sources are coupled to a current source 415 which is in turn coupled to Vss. The current sources 415 may be formed using one or more transistors to provide a constant current at the drains of the NFETs. Although FIG. 4 illustrates that each differential amplifier 320 includes a respective current source 415, in one embodiment, the six differential amplifiers 320 may be coupled to the same current source 415. In this example, the current flowing through the sources of the NFETs may be the same.

The drains of the NFETs are coupled to the output clock signals P0, P90, P180, and P270. Stated differently, the output of each of the stages 305, 310, 315 is coupled to these output clock signals which form the corrected quadrature clock signal. Describing the ring stage 315 first, these stages 315 adjust the phases of the output clock signals P0, P90, P180, and P270 so that the phase shifts between these signals are closer to the ideal phase shift values than the input clock signals IN0, IN90, IN180, and IN270. The gates of the NFETs 5, 6, 11, and 12 are connected to a respective one of the output clock signals P0, P90, P180, and P270 while the drains are connected to different ones of the output clock signals P0, P90, P180, and P270. Specifically, the gate of NFET11 is coupled to P0 while its drain is coupled to P90. The gate of NFET6 is coupled to P90 while its drain is coupled to P180. The gate of NFET12 is coupled to P180 while its drain is coupled to P270. The gate of NFET5 is coupled to P270 while its drain is coupled to P0. Because of this arrangement, the outputs of the NFETs 5, 6, 11, and 12 force the respective phase shift values of clock signals P0, P90, P180, and P270 closer to the ideal phase shift values.

In FIG. 4, because there is an even number of ring stages 315, these stages would not oscillate if it were not for the other stages in the QCP 135. However, the cross-coupled stages 310 in the QPC 135 cause the ring stages 315 to oscillate thereby correcting the phase shift spacing between the outputs signals P0, P90, P180, and P270. Coupling the NFETs 3, 4, 9, and 10 in the cross-coupling stages 310 as shown in FIG. 4 form a current mode latch which stores a state of the QCP 135. In one embodiment, the current mode latch (or current mode logic (CML)) forces opposite nodes (e.g., the drains of the NFETs connected to P0 and P180 or the drains of the NFETs connected to P90 and P270) to an inverting state which results in the QPC 135 oscillating.

The input stage 305 buffers the input clock signals IN0, IN90, IN180, and IN270 and couples the other stages of the QPC 135 to Vdd. The input stages 305 are coupled to Vdd via resistors 410 which may be implemented using a linear resistive element or a non-linear resistive element (e.g., a diode connected transistor). In one embodiment, instead of using NFETs, the circuit shown in FIG. 4 can be reversed so that PFETs are used. In that example, the current sources are coupled to sources of the PFETs while the output clock signals P0, P90, P180, and P270 are coupled to the drains. However, instead of using only NFETs or only PFETs to form the QPC, FIG. 5 illustrates using both.

Figure 5:
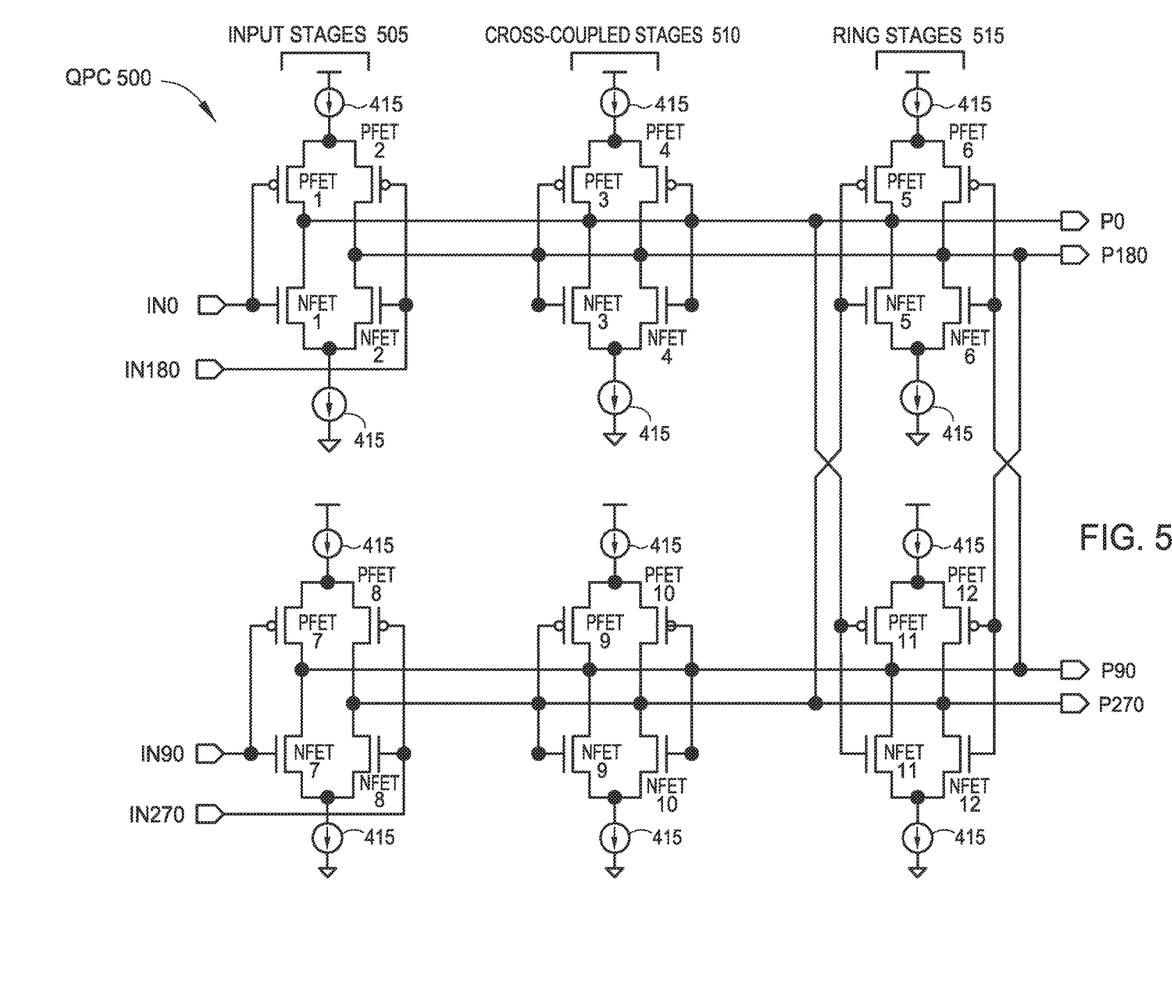
FIG. 5 illustrates a circuit diagram of a quadrature phase corrector, according to one embodiment described herein.

FIG. 5 illustrates a circuit diagram of a QPC 500, according to one embodiment described herein. Although QPC 500 is structurally different than QPC 135 in FIG. 4, the overall functions of the circuits are the same. That is, QPC 500 generates a corrected quadrature clock signal using input stages 505, cross-coupled stages 510, and ring stages 515. In addition to the circuitry shown in FIG. 4, the input stages 505, cross-coupled stages 510, and ring stages 515 each include PFETs whose sources are coupled to the current sources 415 while the drains are coupled to a respective one of the output clock signals P0, P90, P180, and P270.

The gates of the PFETs are coupled to the same gate signal used to control a corresponding NFET—e.g., the gate of PFET1 is coupled to the gate of NFET1, the gate of PFET2 is coupled to the gate of NFET2, and so forth. The PFETs form complimentary circuits to the NFETs. In one embodiment, including both PFETs and NFETs in the stages may improve the common mode power supply rejection ratio of the circuit. Moreover, like in FIG. 4, the current source 415 may be a single current source which is coupled to the different stages in the QPC 500.

Figure 6:
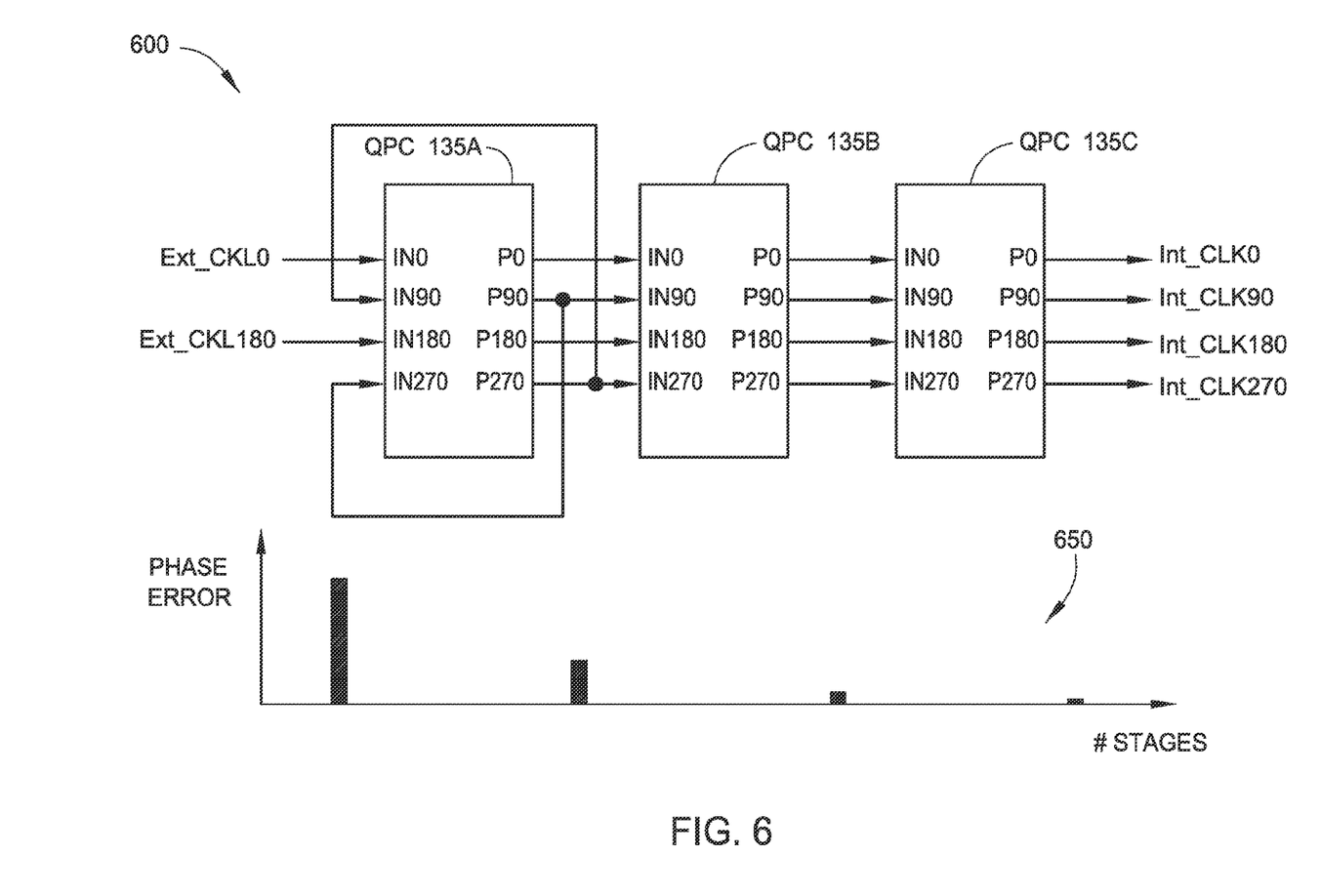
FIG. 6 is a block diagram of a quadrature phase generator that includes a chain of quadrature phase correctors, according to one embodiment described herein.

FIG. 6 is a block diagram of a quadrature phase generator 600 (QPG) that includes a chain of QPCs, according to one embodiment described herein. The QPG 600 may be used in either a source-synchronous communication system or a non-source-synchronous communication system. For example, in a source-synchronous system, the input to the QPG 600 (e.g., Ext_Clk 0 and Ext_Clk 180) is received from a transmitter. In one embodiment, the QPG 600 is disposed on a receiver in order to generate a corrected quadrature clock signal that can be used to recover the data received from the transmitter. As above, the receiver may want to shift the received clock signal by 90 degrees so that the rising edge of the clock signal is in the middle of the data signal eye. As shown here, the QPG 600 receives the differential clock signal Ext_CLK0 and Ext_CLK 180 from the transmitter and generates a corrected quadrature clock signal that includes Int_CLK0, Int_CLK90, Int_CLK180, and Int_CLK270.

In a non-source-synchronous system, the receiver does not receive a clock signal from the transmitter. Instead, the clock signals inputted into the QPG 600 may be generated by a CDR module or any other clock generation circuit in the receiver. In one embodiment, the CDR module generates the differential clock signals Ext_CLK0 and Ext_CLK180 using the data signals received from the transmitter. Thus, regardless whether the input clock signals Ext_CLK0 and Ext_CLK180 are received from a transmitter or generated using a CDR module on the receiver, the QPG 600 outputs a quadrature clock signal where the clock signal Int_CLK90 is phase shifted 90 degrees from Int_CLK0, Int_CLK180 is phase shifted 180 degrees from Int_CLK0, and Int_CLK270 is phase shifted 270 degrees from Int_CLK0.

In FIG. 6, the QPG 600 includes three separate QPCs 135A-C. The QPCs 135 are daisy chained such that the quadrature clock signal outputted by QPC 135A is the input to QPC 135B and the quadrature clock signal outputted by QPC 135B is the input to QPC 135C. As shown by chart 650, the phase error in the input/outputs decreases as the clock signals propagate along the chain. That is, for each of the QPCs 135, the phase spacing of the four output clock signals moves closer to the ideal phase shift spacing. Although FIG. 6 includes three QPCs 135, the QPG 600 can include any number of QPCs 135. As more QPCs 135 are added, the output quadrature clock signal comes closer to attaining the ideal phase shift values, but adding more QPCs 135 increases the cost and size of the QPG 600. As such, the number of QPCs 135 in the QPG 600 may be a result of a tradeoff between how close the quadrature clock signal is to having the ideal phase values and the cost and space required to fabricate the QPG 600.

In QPG 600, a differential signal is used as an input which includes a reference clock signal Ext_CLK0 and an inverted clock signal Ext_CLK180. These signals are used as the inputs IN0 and IN180 into the first QPC 135A. The other two inputs—i.e., IN90 and IN270—are attached to the outputs P270 and P90, respectively. That is, because a differential clock signal is provided to the QPG 600 rather than a quadrature clock signal, the outputs of the first QPC 135A are attached to the other two inputs using feedback loops. Although the difference between the phases of these four input signals and the ideal phase values is significant as shown by the phase error in chart 650, this difference is reduced as the quadrature clock signal outputted by QPC 135A propagates through QPC 135B and QPC 135C.

In one embodiment, instead of using feedback loops to provide the other two inputs in the first QPC 135, the clock signal Ext_CLK0 may be used as both inputs IN0 and IN90, while clock signal Ext_CLK180 is used as both inputs IN180 and IN270. Put differently, the two signals in the differential clock signal are used to simulate a quadrature clock signal. Although doing so results in a significant amount of phase error in the inputs of the QPC 135A (relative to the ideal value of a quadrature phase signal), as discussed above, this phase error is reduced as the quadrature signal propagates through the chain.

In another embodiment, the QPG 600 includes one or more multiplexors coupled to the inputs IN0, IN90, IN180, and IN270. The clock signals Ext_CLK0 and Ext_CLK180 are the two inputs to each of multiplexors. A selection signal may be used to selectively provide the differential clock signals to the inputs IN0, IN90, IN180, and IN270.

In one embodiment, the QPG 600 may be provided with a quadrature clock signal rather than the differential clock signal as shown in FIG. 6. In that case, the feedback loops for using output clock signals P90 and P270 as the input signals IN270 and IN90, respectively, are not needed. Instead, the four signals of the quadrature received clock can be feed directly into the inputs IN0, IN90, IN180, and IN270. Additionally, the QPG 600 may be used when only a single clock is provided rather than a differential clock signal as shown. For example, the first QPC 135A may have three feedback loops from its outputs to inputs IN90, IN180, and IN270 to form the other three input clock signals of a quadrature clock signal.

In one embodiment, one of the clocks signals outputted by the final QPC135C in the chain is used to detect received data. For example, the output clock Int_CLK90 may be used to detect data assuming this signal aligns to the middle of the data eye. Using the QPG 600 to generate a quadrature clock signal from a differential clock signal to perform data detection is only one use of the QPG 600. Another use of the QPG 600 includes correcting the phase alignment in a quadrature signal that may occur from signal noise or skew.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A quadrature phase corrector (QPC) circuit, comprising:
   at least one input interface configured to receive an input clock signal;
   first, second, third, and fourth output interfaces configured to output respective clock signals of a quadrature clock signal;
   a first input stage coupled to the input interface;
   a first differential amplifier, wherein two inputs of the first differential amplifier are coupled to two outputs of the first input stage and two outputs of the first differential amplifier are coupled to the first and second output interfaces; and
   a second differential amplifier, wherein two inputs of the second differential amplifier are coupled to the third and fourth output interfaces and two outputs of the second differential amplifier are coupled to the first and second output interfaces, wherein the two outputs of the first and second differential amplifiers affect, at least in part, the respective clock signals outputted by the third and fourth output interfaces.

2. The QPC of claim 1, further comprising:
   first, second, third, and fourth input interfaces comprising the at least one input interface, wherein the first input stage is coupled to the first and second input interfaces;
   a second input stage coupled to the third and fourth input interfaces;
   a third differential amplifier, wherein two inputs of the third differential amplifier are coupled to two outputs of the second input stage and two outputs of the third differential amplifier are coupled to the third and fourth output interfaces; and
   a fourth differential amplifier, wherein two inputs of the fourth differential amplifier are coupled to the first and second output interfaces and two outputs of the fourth differential amplifier are coupled to the third and fourth output interfaces.

3. The QPC of claim 2, wherein the first input stage comprises a fifth differential amplifier, wherein two inputs of the fifth differential amplifier are coupled to the first and second input interfaces and two outputs of the fifth differential amplifier are coupled to the two inputs of the first differential amplifier and to the first and second output interfaces.

4. The QPC of claim 3, wherein the second input stage comprises a sixth differential amplifiers, wherein two inputs of the sixth differential amplifier are coupled to the third and fourth input interfaces and two outputs of the sixth differential amplifier are coupled to the two inputs of the third differential amplifier and to the third and fourth output interfaces.

5. The QPC of claim 1, wherein the first differential amplifier comprises first and second transistors, wherein a gate of the first transistor is coupled to a first output of the first input stage and a gate of the second transistor is coupled to a second output of the first input stage, wherein a drain of the first transistor is coupled to the first output interface and a drain of the second transistor is coupled to the second output interface, and wherein sources of the first and second transistors are both coupled to a constant current source.

6. The QPC of claim 1, wherein the second differential amplifier comprises first and second transistors, wherein a gate of the first transistor is coupled to the third output interface and a gate of the second transistor is coupled to the fourth output interface, wherein a drain of the first transistor is coupled to the first output interface and a drain of the second transistor is coupled to the second output interface, and wherein sources of the first and second transistors are both coupled to a constant current source.

7. The QPC of claim 1, wherein the input clock signal comprises a differential clock signal that includes a reference clock signal and an inverted clock signal.

8. A quadrature phase corrector (QPC), comprising:
   first, second, third, and fourth output interfaces configured to output respective clock signals of a quadrature clock signal;
   first and second input stages configured to receive input clock signals, wherein two outputs of the first input stage are coupled to the first and second output interfaces and two outputs of the second input stage are coupled to the third and fourth output interfaces;
   first and second cross-coupled stages, wherein inputs and outputs of the first cross-coupled stage are coupled to the first and second output interfaces and inputs and outputs of the second cross-coupled stage are coupled to the third and fourth output interfaces; and
   first and second ring stages, wherein two inputs of the first ring stage are coupled to the third and fourth output interfaces and two outputs of the first ring stage are coupled to the first and second output interfaces, wherein two inputs of the second ring stage are coupled to the first and second output interfaces and two outputs of the second ring stage are coupled to third and fourth output interfaces.

9. The QPC of claim 8, wherein the first and second cross-coupled stages are configured to cause the QPC to oscillate in response to receiving the input clock signals.

10. The QPC of claim 9, wherein the first and second cross-coupled stages each comprises a latch.

11. The QPC of claim 8, wherein the first and second ring stages are configured to correct a phase shift between the output respective clock signals of a quadrature clock signal relative to a phase shift between the input clock signals.

12. The QPC of claim 8, wherein the first cross-coupled stage comprises a first transistor and a second transistor, wherein a gate of the first transistor is coupled to the first output interface and a source of the first transistor is coupled to the second output interface, and wherein a gate of the second transistor is coupled to the second output interface and a source of the second transistor is coupled to the first output interface.

13. The QPC of claim 12, wherein drains of the first and second transistors are coupled to a constant current source.

14. The QPC of claim 8, wherein the first ring stage comprises a first transistor and a second transistor, wherein a gate of the first transistor is coupled to the fourth output interface and a source of the first transistor is coupled to the first output interface, and wherein a gate of the second transistor is coupled to third output interface and a source of the second transistor is coupled to second output interface.

15. The QPC of claim 8, wherein the first output interface drives a reference clock signal of the quadrature clock signal, the second output interface drives a 180 degree phase shifted clock signal of the quadrature clock signal, the third output interface drives a 90 degree phase shifted clock signal of the quadrature clock signal, and the fourth output interface drives a 270 degree phase shifted clock signal of the quadrature clock signal.

16. A quadrature phase generator (QPG), comprising:
a first QPC configured to receive input clock signals; and
a second QPC configured to receive a first quadrature clock signal from the first QPC and output a second quadrature clock signal,
wherein the first and second QPCs each comprises a plurality of differential amplifiers, and wherein the first QPC is configured to correct a phase shift between respective clock signals in the first quadrature clock signal relative to a phase shift between the input clock signals, and the second QPC is configured to correct a phase shift between respective clock signals in the second quadrature clock signal relative to the phase shift between the respective clock signals in the first quadrature clock signal,
wherein the first and second QPCs each comprises an input stage, a cross-coupled stage, and a ring stage.

17. The QPG of claim 16, wherein the cross-coupled stages are configured to cause the first and second QPCs to oscillate.

18. The QPG of claim 16, wherein the ring stage in the first QPC is configured to correct the phase shift between respective clock signals in the first quadrature clock signal and the ring stage in the second QPC is configured to correct the phase shift between respective clock signals in the second quadrature clock signal.

19. A quadrature phase generator (QPG), comprising:
a first QPC configured to receive input clock signals; and
a second QPC configured to receive a first quadrature clock signal from the first QPC and output a second quadrature clock signal,
wherein the first and second QPCs each comprises a plurality of differential amplifiers, and wherein the first QPC is configured to correct a phase shift between respective clock signals in the first quadrature clock signal relative to a phase shift between the input clock signals, and the second QPC is configured to correct a phase shift between respective clock signals in the second quadrature clock signal relative to the phase shift between the respective clock signals in the first quadrature clock signal, wherein the first QPC includes a plurality of input interfaces configured to receive the input clock signals, wherein at least one of the plurality of input interfaces is coupled to at least one clock signal of the first quadrature clock signal outputted by the first QPC via a feedback loop.

* * * * *